United States Patent [19]

McCrocklin et al.

[11] Patent Number: 5,765,198
[45] Date of Patent: Jun. 9, 1998

[54] TRANSPARENT RELOCATION OF REAL MEMORY ADDRESSES IN THE MAIN MEMORY OF A DATA PROCESSOR

[75] Inventors: Andrew Jackson McCrocklin; Douglas Brent Meyer; Eric Cedric Pilmore, all of San Diego; Sandra Cecilia Lee, Solano Beach, all of Calif.

[73] Assignee: Cray Research, Inc., Eagan, Minn.

[21] Appl. No.: 595,528

[22] Filed: Feb. 1, 1996

[51] Int. Cl.⁶ .................................................. G06F 12/06
[52] U.S. Cl. .................... 711/165; 711/170; 711/154; 711/173; 711/5; 395/651
[58] Field of Search .................. 395/481, 492, 395/497.01, 497.04, 651; 711/5

[56] References Cited

U.S. PATENT DOCUMENTS

| | | | |
|---|---|---|---|
| 4,493,034 | 1/1985 | Angelle et al. | 395/653 |
| 4,970,640 | 11/1990 | Beardsley et al. | 395/284 |
| 5,101,346 | 3/1992 | Ohtsuki | 395/800 |
| 5,193,202 | 3/1993 | Jackson et al. | 395/497.04 |
| 5,428,758 | 6/1995 | Salsburg | 395/492 |
| 5,459,854 | 10/1995 | Sherer et al. | 395/497.01 |
| 5,504,801 | 4/1996 | Moser et al. | 379/34 |
| 5,584,042 | 12/1996 | Cormier et al. | 395/497.04 |
| 5,594,903 | 1/1997 | Bunnell et al. | 395/652 |

*Primary Examiner*—Eddie P. Chan
*Assistant Examiner*—Gary J. Portka
*Attorney, Agent, or Firm*—Schwegman, Lundberg, Woessner & Kluth, P.A.

[57] ABSTRACT

An operating system (OS) of a data processor physically relocates segments of memory containing real addresses used by the operating system itself, which addresses must remain unaltered within the system. The system identifies a memory bank containing a source segment having such real addresses, quiesces the OS, and copies the source segment to a target memory module. A register identifying the real addresses stored in the target module is renamed to the addresses of source segment, and the OS resumes executing normal tasks. The data processing system may have multiple system modules each having processors, memory, and/or other components.

20 Claims, 6 Drawing Sheets

TRANSPARENT RELOCATION OF REAL MEMORY ADDRESSES IN THE MAIN MEMORY OF A DATA PROCESSOR

BACKGROUND OF THE INVENTION

The present invention relates to electronic data processing, and more specifically concerns improvements in relocating real addresses within a data-processing system.

One of the major features of an operating system's central kernel is its heavy use of "real" memory addresses. Real addresses are those which specify a certain physical location in memory. Virtual addresses, on the other hand, specify a "logical" location, and must be translated to real addresses before they can be physically accessed; their corresponding real addresses can change at any time. The advantage of virtual addressing is that data and code can be easily shifted to different physical memory locations. A disadvantage, however, is that the required translation to a real or physical address incurs a time penalty, thus slowing down access to the data or code. The kernel contains many data structures and routines which reference real addresses, mostly for managing virtual memory. Although the data and routines referencing real addresses hard-coded in the kernel can be quite large (e.g., many megabytes), they also tend to be compact, in the sense that they occupy contiguous blocks of memory, frequently all within a single block or segment—a "kernel segment"—of memory. Another name for a memory segment containing data whose real addresses must remain fixed is a "pinned segment."

Many large data-processing systems are designed to be reconfigurable. One advantage of reconfigurability is the ability to add or change system resources, such as the number of processors, the amount of main memory, or the type and number of I/O controllers. Another is the ability to bypass weak or failed components so as to continue operation.

Many systems have statically reconfigurable memory. That is, each physical memory card, bank, or module has switches which set the high-order bits to which the memory in that bank will respond. The bank then generates a "segment detect" signal when its pattern of high-order address bits appears, and passes the low-order bits on to the memory chips physically located in its bank. Some conventional systems employ registers instead of manual switches, so that a service processor or other facility can specify which memory banks are to contain which segments of the overall addressing range of the system.

Although a statically reconfigurable memory can physically relocate segments of real addresses within the system, it can do so only at certain times. Typically, segment switches or registers can be reset only from a cold boot or initial program load (IPL) of the entire data-processing system. In a large mainframe or server system, an IPL is a lengthy operation, and is undertaken only when necessary: a system-wide failure, a physical move, or a major upgrade. Many systems are now designed to run continuously through the repair of failed components and the hot-plugging of additional facilities. But such run-forever systems still cannot tolerate the relocation of pinned or kernel address segments without a total shutdown.

Redundant systems designed to run continuously despite any major component failure often have duplicated main memory and other components. If a pinned segment of main memory is to be replaced or reconfigured, its twin takes over. This is possible only because the segments having the same real addresses always have identical contents. Although systems of this type can be very reliable, they are wasteful of physical resources. Every component must have at least one dedicated spare, which cannot be employed for any other purpose.

The conventional methods for relocating the physical modules containing pinned segments of real addresses lie at opposite ends of a cost/capability scale. Statically reconfigurable systems require little extra hardware to implement; but physically relocating memory segments without disturbing their real addresses can only be performed infrequently, because it completely disrupts the system for long periods of time—typically on the order of four to ten minutes. Redundant systems can relocate real addresses almost instantaneously, but at the very high cost of duplicating the physical memory for those segments as well as processors and other hardware to maintain the memory contents in nearly clock-cycle synch with each other.

It is also possible to reconfigure the kernel code so as to change its real-address references to different real addresses. However, this is a difficult and precise task, prone to system-crippling errors. Moreover, changing addresses in the kernel code while the kernel is actually running the system would be formidable indeed.

Situations arise where it would be advantageous to relocate segments whose real addresses must remain unchanged during time intervals somewhere between clock-cycle nanoseconds and cold-boot hours. For example, the removal of faulty memory could easily justify one or two seconds' pause or suspension of running applications. Reconfiguration of a modular system into multiple or different quasi-independent subsystems could be done at off-peak hours when a short suspension of normal operation is not unreasonable. Such a compromise, however, is not simple or straightforward to implement. Real addresses are, almost by definition, used in almost every instruction execution at the lowest level. How can a program, whose processor uses real addresses constantly, shift them to another physical location without tripping over its own feet?

SUMMARY OF THE INVENTION

The present invention provides a "dynamically reconfigurable" data-processing system, which includes the necessary function of physically relocating segments of memory whose real addresses must remain unaltered. Relocation occurs without disrupting the running system, and without adding significant hardware to the overall system. Also, relocation can occur at any time during system operation.

Broadly, the invention achieves these and other objectives by identifying a source or detaching memory segment on a source physical module to be detached which contain real addresses that must be preserved. (Although called a "kernel" segment, such a segment is not limited to uses with or for an OS kernel.) The operating system then quiesces itself so that it operates only within a predictable restricted range. The OS determines which target physical memory module is to receive the kernel segment containing the real addresses, and copies its contents into that module. The target module is then reset to respond to the same real addresses as those of the source module. The source module is reset so as not to respond to its former real addresses.

DESCRIPTION OF A PREFERRED EMBODIMENT

Most general-purpose data-processing systems employ a backplane having address, data, and control buses for interconnecting a number of cards, boards, or other functional modules. In most of these systems, the individual modules perform different specialized functions. A processor module may contain one or more microprocessors for performing functional tasks; many systems may include multiple processor modules. A memory module is populated with one or more banks of addressable memory for storing data and programs. Input/output (I/O) modules interface the system to external devices such as bulk storage, displays, and communications adapters. The presently preferred system has an overall organization which differs somewhat from most contemporary systems, although these differences are irrelevant to the invention as such. That is, the invention may be easily adapted to any system architecture which provides the basic requirements for implementing it.

Figure 1:
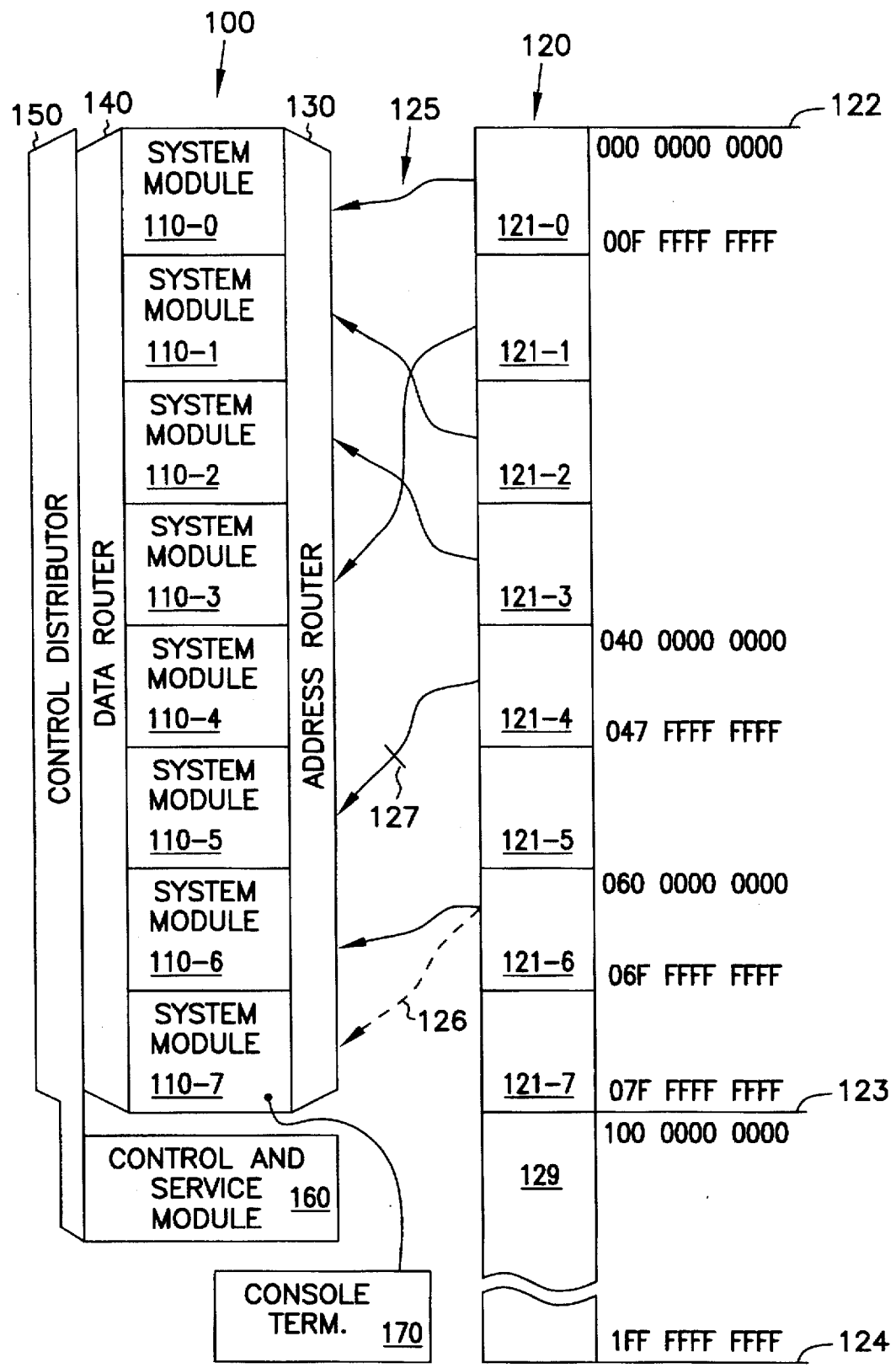
FIG. 1 is a schematic diagram of a data-processor in which the invention is implemented.

FIG. 1 shows a data-processing system 100 capable of implementing the invention, along with an illustrative memory-address map for the system. The architecture of system 100 employs a number of essentially identical "system modules" 110, each of which can contain processors, memory, and/or I/O adapters. That is, each module 110 can perform a slice of all the functions of a system, rather than implementing part or all of only a single system function—a fully-populated module 110 may function as a complete data-processing system by itself, requiring only power and incidental control from the remainder of system 100. The preferred system uses sixteen system modules; for simplicity, FIG. 1 shows only eight, labeled 110-0 through 110-7.

On the other hand, the processors, memory, and I/O of each system module can interact seamlessly and directly with the processors, memory, and I/O functional units of other modules. For example, all the memory in the entire system 100 may be organized into a single address space, so that any processor in any module can directly address any memory chip in any other module.

Address map 120 for an illustrative system 100 has a number of logical blocks or segments 121 of memory addresses running from an initial address 122 to a final address 123—e.g., from hex '000 0000 0000' to hex '07FF FFFF FFFF', using 41 address bits. Within this total range of addresses, each segment has a segment range of addresses, from a base or starting address to a limit address, such as from hex '000 0000 0000' to hex '00F FFFF FFFF' for segment 121-0. (In this embodiment, logical segment addresses are assigned on 8 GB boundaries, although each system module can only physically hold 4 GB. Also, the system reserves addresses '100 0000 0000' (at numeral 123) to '1FF FFFF FFFF' (at 124) as an alternative space 129 for special purposes, so that only the range between lines 122 and 123 is available for memory segments.

In this embodiment, the maximum physical memory in any segment 121 is limited to that which a filly-populated system module 110 can physically hold 4 GB in this implementation. As described later, the system defines the starting address and the size of each segment; a segment may be defined to be smaller than the maximum, and it can be only as large as the physical memory actually present on the module which holds it. (Segment 121-4, for example, is defined to use only 2 GB of address space, followed by a gap in which no addresses are valid.) In addition, this embodiment permits only a single segment to be physically located on any one system module. None of these restrictions, however, is necessary to the concept of the invention. It is not difficult to design a processing system which has different segment sizes, which permits a single segment to span multiple system modules, and which accommodates multiple segments—either contiguous or not—on a single module Solid arrows 125 indicate an arbitrary assignment of some of the memory segments 121 to particular system modules 110. For example, the system may assign logical segment 121-0, having a base address '000 0000 0000' and a limit address '00F FFFF FFFF', to system module 110-0. System modules 110-1, 110-2, and 110-3 hold the physical memory for logical segments 121-2, 121-3, and 121-1, respectively. Physical module 110-4 is not assigned to any logical segment; either it has no physical memory installed, or that memory is not used, for one reason or another. Logical segment 121-4 is located on physical module 110-5. This segment, however, is defined to contain only 2 GB of address space. Small segments can arise for a number of arbitrary reasons, or because module 110-5 has only 2 GB of physical memory installed. The following 6 GB of logical address space is not used. None of the address space of segment 121-5 corresponds to any physical memory on any system module; that is, none of the modules responds to addresses within that range, and they are thus not valid within this particular configuration of system 100.

In the description to follow, we shall assume that the real addresses referenced by the OS kernel all reside within the address range of segment 121-6, from hex '060 0000 0000' through '06F FFFF-FFFF'. System module 110-6 carries 4 GB of physical memory which responds to addresses within that segment. The description will illustrate relocating these real addresses to system module 110-7, which carries 4 GB of physical memory. Dashed arrow 126 symbolizes this move. Module 110-7 may have been dormant in system 100; it may have been hot-plugged into the system expressly for this purpose; or it may have been active and assigned to another, non-kernel, segment. When the relocation has been finished, module 110-6 may be removed from the system or assigned to another segment. (Break 127 indicates another, non-kernel, segment 121-4 to be detached, to illustrate the difference between relocating a kernel segment and detaching an ordinary segment.)

Address router 130 interconnects system modules 110 with each other so that a processor in one module can send any address in range 120 to memory physically located in the same module or in a different module. In the simplest case, router 130 may be a single address bus. The preferred system 100 employs multiple arbitrated buses for simultaneous transfers. Data read from or written to memory addresses travel over data router 140 between the modules which send and receive it. Although data router 140 may again be implemented as a single bus, we prefer a crosspoint switch for multiple simultaneous data transfers. The actual construction of routers 130 and 140 is conventional, and is not relevant to the present invention.

Control distributor 150 routes control signals among the various system modules 110. It also carries global control and power signals between the system modules and module 160, which performs control and service functions. System 100 implements block 160 physically as a small internal processor and a remote workstation, connected to each other by a serial communications link. Block 160 is entirely conventional. A terminal 170 serves as the console for system 100; it may be connected in a conventional manner to the I/O subsystem in any of the system modules 110.

Figure 2:
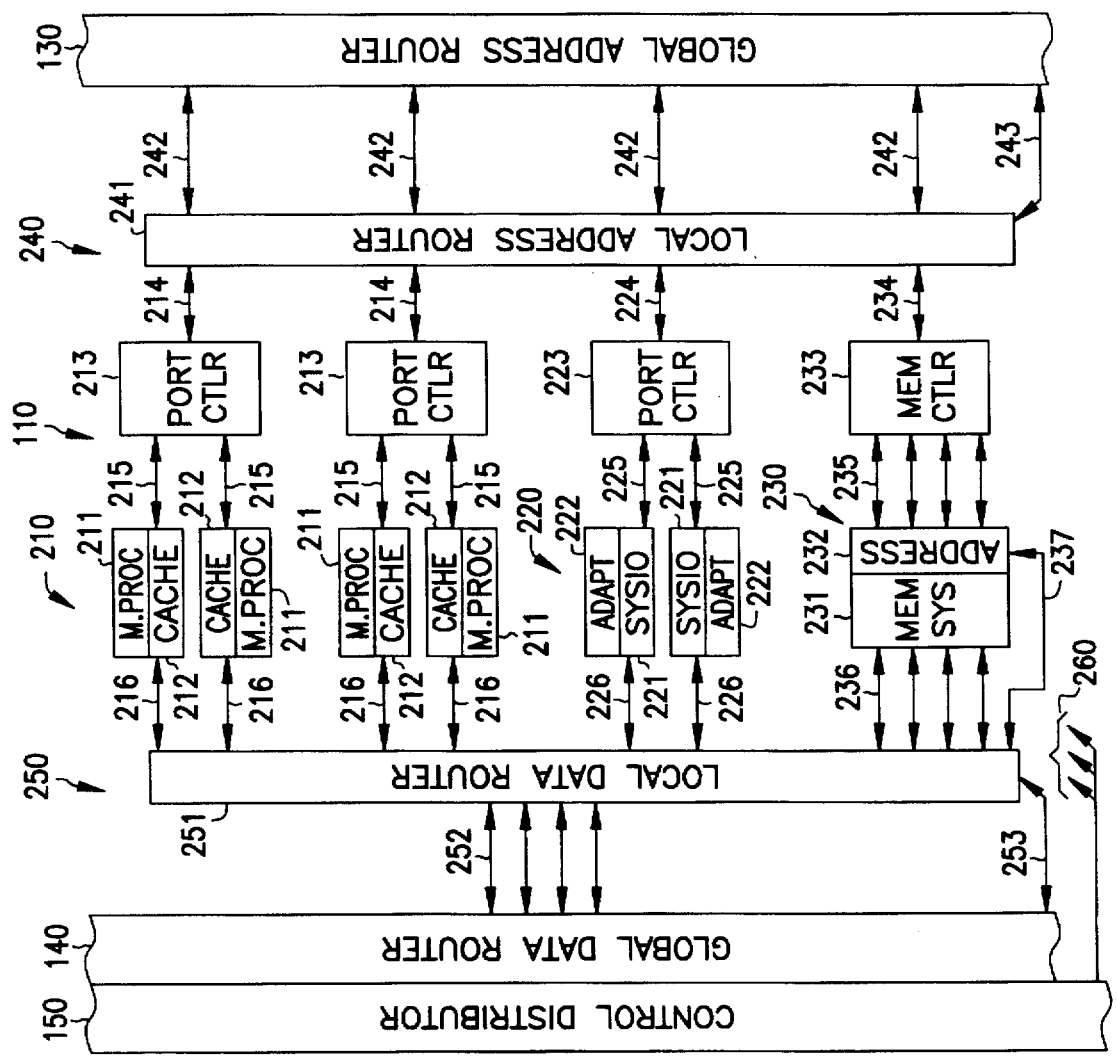
FIG. 2 shows one of the system modules of FIG. 1

FIG. 2 details a representative system module 110, FIG. 1. Again, many alternative configurations will satisfy the requirements of the invention. Processor subsystem 210 contains the physical space and connections for up to four SPARC microprocessors 211 and their associated cache memories 212. (SPARC is a trademark of SPARC International, Inc. for commercially available microprocessor designs.) Conventional port controllers 213 couple addresses lines 214 to the individual caches from a local address router 240 via lines 215. Data lines 216 transfer data at these addresses to and from a local data router 250 within each system module 110.

I/O subsystem 220 has facilities for zero, one, or two publicly available "SBus" system I/O buses 221. A number of conventional adapters 222 plug into these buses for attaching various types of external I/O devices, such as terminals and disk drives. System I/O addresses travel between buses 221 and port controller 223, and thence to local address router 240 via lines 224 and 225. (Controllers 223 and 213 are identical in construction.) Data travels to and from router 250 on lines 226.

Memory subsystem 230 may hold system read-write random-access memory (RAM) in block 231. Addressing registers 232 respond to address signal from local address router 240 through conventional memory controller 233, via lines 234 and 235. Lines 236, as well as 237, transfer data to and from local data router 250. Again, memory subsystem 230 may hold a full 4 GB complement of RAM, some fraction of its 4 GB capacity, or no RAM at all.

Local address router 240 contains conventional logic for prioritizing, arbitrating, and timing transfers of addresses between system module 110 and global address bus 130. Four separate sets of address lines 242 connect these units, because this implementation of system 100 can handle up to four simultaneous transfers. Lines 243 coordinate and time these transfers. Local data router 250 includes conventional logic for routing data specified by addresses on router 240 to the various subsystems 210-230 on each system module. Sets of lines 252 effect data transfers among the lines 216, 226, and 236 to the global data router 140. Lines 253 control the connection of various data paths in router 140 to lines 252 of the local data router 250. Lines 260 transmit and receive the necessary control signals between global control distributor 150 and the various units of system module 110. None of these is directly relevant to the operation of the present invention.

Figure 3:
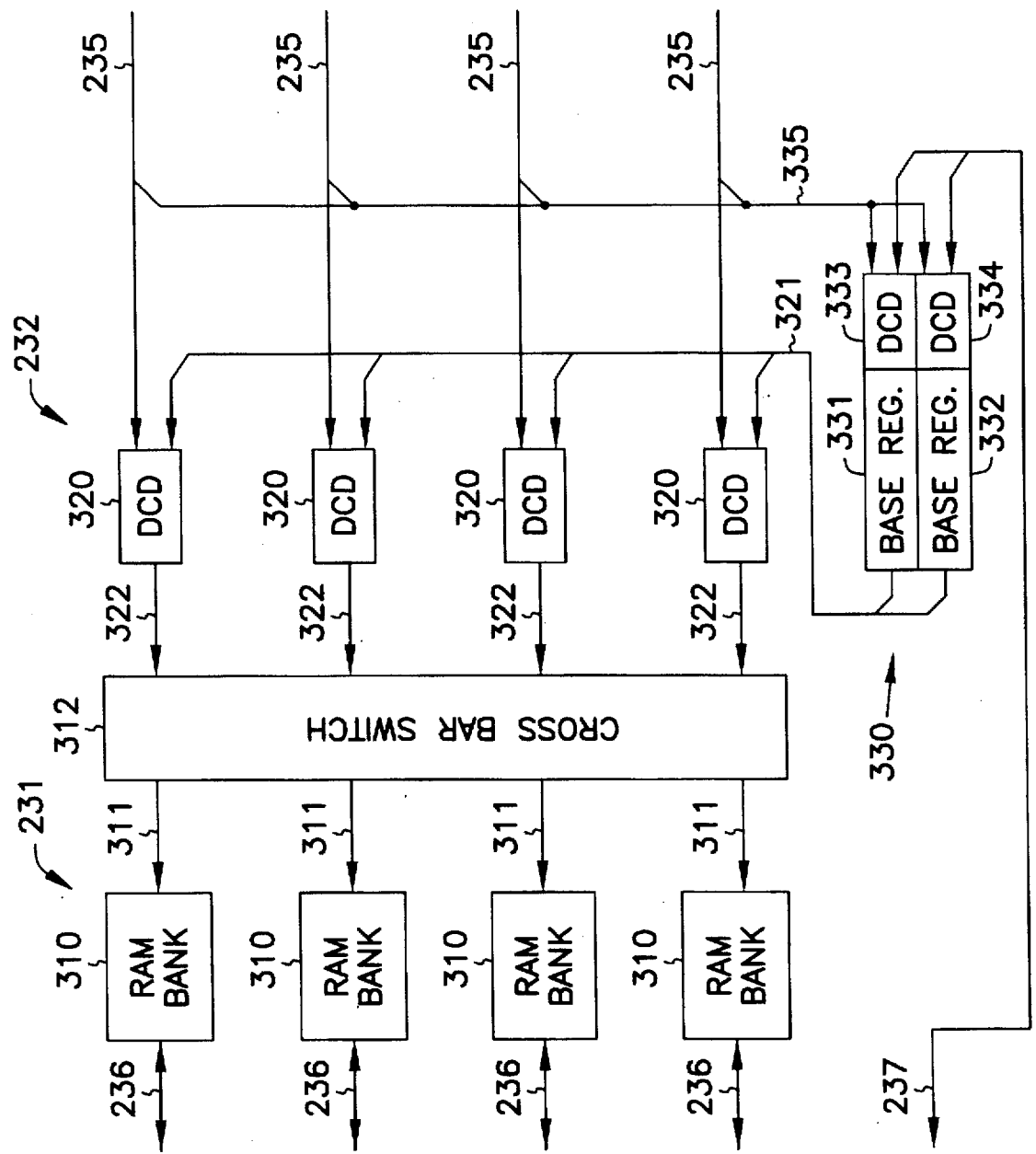
FIG. 3 details the memory block of the system module of FIG. 2.

FIG. 3 expands a portion of memory subsystem 230, FIG. 2, relevant to the invention. Blocks 310 hold the physical memory corresponding to a full segment in four banks of RAM, each holding one-quarter of the total amount, or 1 GB in this implementation. None, part, or all of this capacity may be actually installed on any given system module 110. Each bank connects to a separate set of data input/output lines 236, so that up to four memory transfers may occur simultaneously within the same system module 110 for different addresses presented on address lines 311. Crossbar switch 312 coordinates such simultaneous transfers in a conventional manner.

Address decoders 320 receive respective 41-bit memory addresses from each of the four address buses in global router 130, FIGS. 1 and 2, via lines 235. Lines 321 present signals indicating the range of addresses for the data stored in each RAM bank 310. When the address bits of lines 235 match the range of addresses indicated on lines 321, the appropriate decoder 320 sends the low-order address bits over lines 322 to bank switch 312 for routing to the proper set of lines 311. Again, the present embodiment uses the highest-order address bit of lines 235 to indicate whether an address is a segment address or an alternative address, and uses bits 34–37 as a segment designator to specify one of sixteen possible segments. The low-order 33 bits pass to lines 322 and 311 as the addresses of individual bytes within a segment.

Segment register set 330 identifies which of the possible segments is present in the memory subsystem 230 of its system module 110, and how large that segment is. To this end, registers 331 and 332 contain representations of the base address and the number of bytes in the segment stored in RAM banks 310, and transmit these representations on lines 321 to decoders 320. The contents of these registers are loadable (and readable as well) from data routers 251 and 140. Decoders 333 and 334 are used when loading segment data into registers 331 and 332. They assign each register a fixed address in the system's alternative address space 129, FIG. 1. Lines 335 send addresses from lines 235 to these decoders; registers 331 and 332 then transfer data between the registers and the data bus on line 237, in the same way as other memory locations transfer data. Modifications of this embodiment to permit multiple or partial segments on one system module are straightforward. Likewise, instead of holding base-address and size representations of a segment, registers 331 and 332 might hold low and high addresses, or some other specifications of the range or ranges of addresses on the module. The significant characteristic of register set 330 is that system 100 itself can alter the real addresses to which the installed memory in the system module responds.

Figure 4:
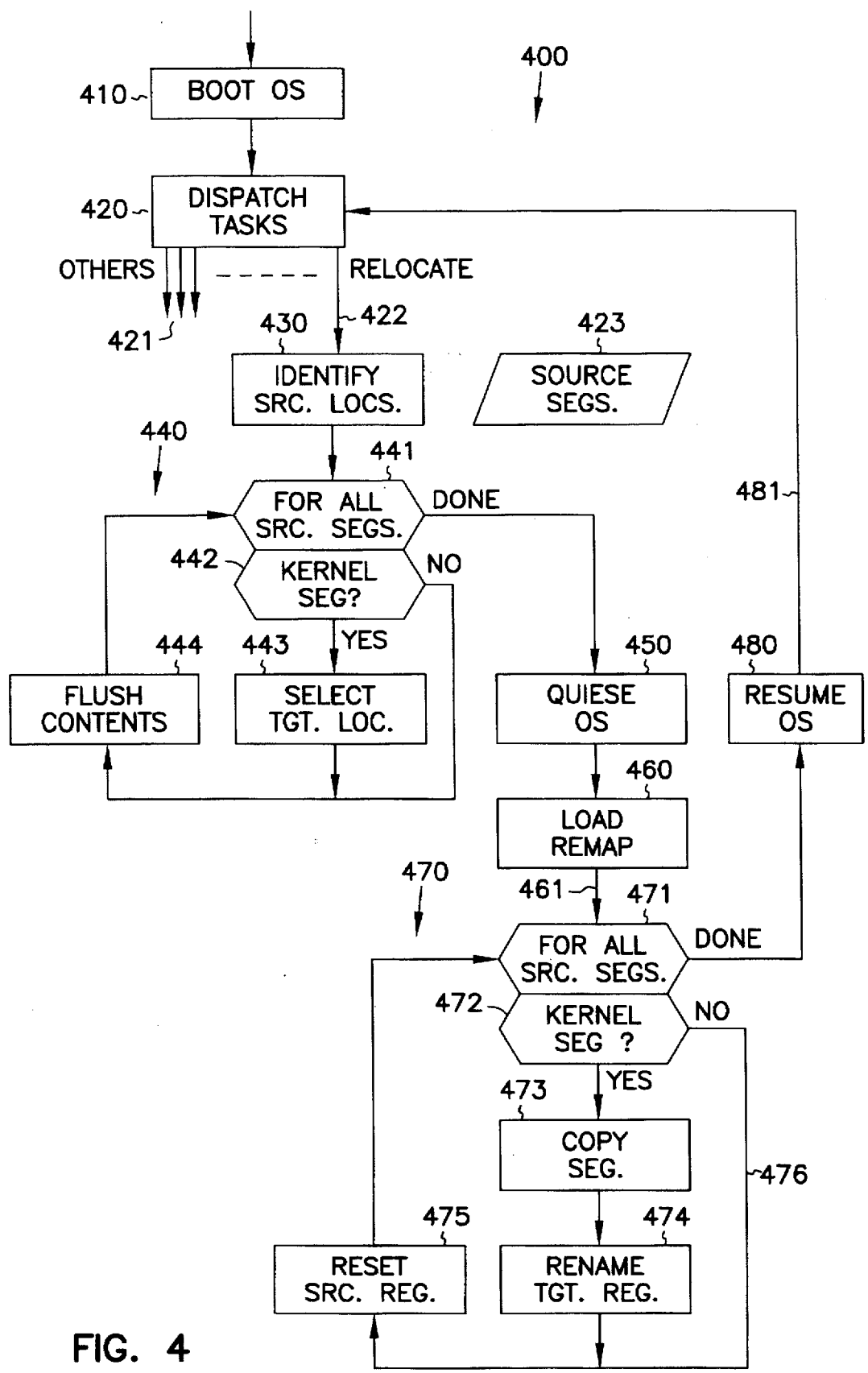
FIG. 4 is a high-level flow chart showing the overall operation of the invention on the system of FIGS. 1–3.

FIG. 4 shows the overall method 400 of relocating segments in accordance with the invention.

Block 410 initializes data-processing system 100. This step occurs when the system is powered up and may also take place at other times, such as when a "cold start" is desired after a major malfunction. When the operating system is ready to handle user applications and other normal tasks, conventional task dispatcher 420 selects tasks for execution and assigns them to particular processors, as symbolized by arrows 421. The functions of blocks 410 and 420 are entirely conventional. The embodiment described here uses the facilities of the publicly available Solaris® operating system from Sun Microsystems, Inc.

One of the tasks that block 420 can initiate is the memory-relocation routine for carrying out the invention, as shown at arrow 422. In the usual case, a system operator at console 170, FIG. 1, initiates a relocation task when one of the system modules 110 is to be replaced for a failure in one of its functions, or for upgrading its capabilities, or for some other reason. The operator provides a specification 423 of source segments are to be relocated. Preferably, the operator actually specifies particular system module is to be detached. The operator may, however, name the source segment directly (i.e., in terms of its real addresses), or in any other convenient manner. Although segment relocation is an "application" program in the sense that it starts under the normal task scheduler 420, the OS's security system should obviously restrict its execution authority to systems administrators and other trusted personnel.

Block 430 identifies the source segment by translating the operator's specification into the parameters of the segment currently located in the memory of the specified module. In system 100 the set of real addresses referenced by the kernel (the "kernel segment") can change during operation, so that block 430 must execute at the time of the relocation task. The system itself keeps a dynamic record of which segment is the kernel segment. In the example memory map 120, FIG. 1, the source kernel segment to be relocated is 121-6, currently located in system module 110-6. System 100 allows relocation of only a one segment during a single relocation task, although the segment may be either a kernel or a non-kernel segment. This is not a necessary limitation, and in fact the routines of FIG. 4 actually do provide for moving multiple segments in any combination during a single execution of blocks 430–480.

After the source segments have been identified, blocks 440 determine the target locations which are to receive the source segments identified at 423. Block 441 iterates through all the source segments found in the specification 423, and block 442 identifies which of them is a "kernel segment" containing the real addresses to be preserved unaltered. Block 443 selects a target location for the kernel segment. In this example, kernel segment 121-6 moves to a target location in module 110-7, as symbolized by arrow 126, FIG. 1. The target location could be specified directly, say in the list 423. We prefer to select the target automatically, by scanning the modules 110 for the first one which contains a block of memory the same size as the segment; if none exists, a larger block is found, and its logical size is decreased via register 332, FIG. 3. Extensions to systems having multiple segments per module, and to differing segment sizes, are straightforward. Block 444 then flushes the data from the segment at the target location to some other location, because that memory will be overwritten by data from the source segment.

(For a non-kernel segment, such as source segment 121-4 in FIG. 1, block 444 merely flushes the source-segment contents from system module 110-5 to any convenient secondary storage, such as a disk drive. That is, the physical location of a non-kernel segment is immaterial, because programs reference its contents only by virtual addresses, and not directly by real ones. This function may occur at other times and in other forms for other systems.)

Block 450 quiesces the operating system in preparation for moving kernel segments. The purpose is to suspend all system activity in such a way that steps 470 can be performed without requiring any explicit memory references to the kernel segments.

Figure 5:
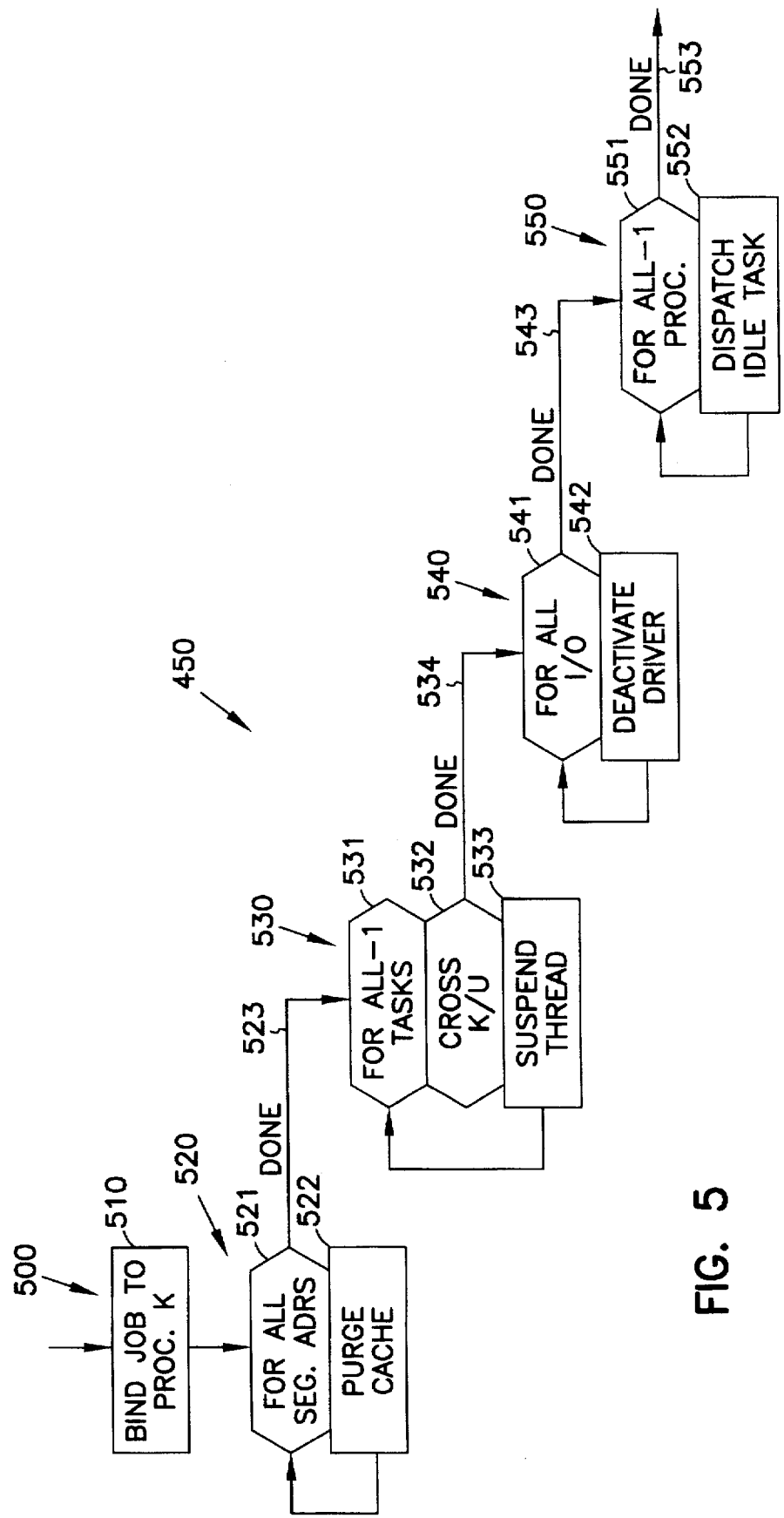
FIG. 5 details the quiesce-OS block of FIG. 4.

FIG. 5 details a convenient method 500 for quiescing the OS, modified from a "checkpoint/resume" feature which is already present in the Solaris operating system. The conventional purpose of this feature is to suspend all application programs, allowing the system to be powered off and later powered back on, resuming operation at the same point in the programs. It provides a warm-start capability which is much less time-consuming than the cold boot of block 410, FIG. 4. (In FIG. 5, the invention adds blocks 510, 520, and 550 to the Solaris feature.)

Normally, a multiprocessor system may execute a task on any available processor, as determined by scheduler 420, FIG. 4. For the relocation task, however, block 510 first binds the quiesce-OS task to one particular processor 211 of one particular system module 110 in system 100. We designate this unit "processor K." In system 100, it is advantageous that processor K be the one which normally handles the master clock interrupt for the entire system.

In blocks 520, processor K purges the caches 212 of the processor groups 210, FIG. 2, of all references to addresses in the source segment. Block 521 finds address references to the source segment in any cache. Block 522 purges each reference, preferably by invalidating any cache line containing it. Different systems provide different methods for purging caches; system 100 employs coherent caches, so that writing zeros to all memory locations of a segment causes processor K to become the owner of any cache lines referencing the segment locations, and voids all cache references thereto which might exist in other processor groups 210. Thus, processor K writes zeros to all addresses of a source segment if it is a non-kernel segment, and to all addresses of a target location for a kernel segment. Processor K then reads a buffer the same size as a cache, to fill the cache with references to the buffer. As a result, any cache references to memory in the segment caused by the previous operation will have been removed or flushed out. The buffer is considered permanent or pinned; that is, it is guaranteed to be located within a kernel segment. DONE exit 523 leads to blocks 530, of the conventional checkpoint/resume operation.

Blocks 530 suspend all currently executing tasks—except, of course, routine 500 itself. For all currently executing tasks found by block 531, block 532 detects when any execution threads cross the kernel/user interface of the OS during its execution by block 420. The Solaris OS checks certain conditions whenever a user task returns from a system call or interrupt. If a CHECKPOINT signal is active, the OS sets a STOP bit in the state field of that task. The OS dispatcher 421 will not dispatch or execute any thread of a task having this bit active. Block 533 suspends threads by placing them into a conventional wait list, from which they can restart at a later time. Different operating systems may employ different methods for shutting down tasks gracefully; as noted, a function is frequently available for providing a "warm boot" capability. When all user threads are inactive, control passes to blocks 740 via DONE exit 534.

Blocks 540 suspend all I/O activity within system 100. This permits the OS to ignore external interrupts for a period of time, and prevents the I/O from making memory references to any source segments. Block 541 iterates through a list of all I/O drivers. Block 542 sends each driver a command which deactivates it—that is, the driver can no longer respond to a request for its services. Completion of I/O operations already in progress is device-dependent. Some device operations must be allowed to continue to completion. Others can be terminated immediately, if the driver can retry or restart an operation and if the device supports such an activity.

The purpose of blocks 550 is to suspend enough of the kernel-level activity remaining after the preceding blocks 510–540 have been executed to permit transfer of the source segments without altering the contents of any memory locations in those segments. Again, only the single designated processor K executes these blocks. When control passes to blocks 550 via line 543, block 551 iterates through all processors 211 in every system module 110. Block 552 dispatches a dummy task to the current processor and returns to block 751 to select the next processor. The dummy task is conveniently a simple tight loop of instructions which can execute continuously from the cache 212 associated with its own processor 211, without requiring any input to, or producing any output from, the cache. Any routine which isolates each processor from the rest of the system will serve the purpose of block 552. Some microprocessors may be capable of idling or shutting down, by applying an external signal or by other means, without requiring a sequence of instructions; in such cases, block 752 might merely issue such a signal or perform some comparable action. Exit 553 indicates that all processors except processor K have been isolated.

Returning to FIG. 4, block 460 causes the one remaining unit, processor K, to load the remap routine 470 in such a way as to prevent any references to a detaching kernel segment. In this embodiment, processor K achieves this goal by executing the entire routine 470 from instructions already within its own cache 212, without requiring any input to, or producing any output from, that cache. In a preferred method for system 100, processor K copies a block of object code from system memory to the cache 212 associated with processor K, by jumping (using "GOTO" instructions) through the bytes of the code where it is stored in one of the memory subsystem 230. All such jumps must be smaller than the length of a cache line (64 bytes in this example). Exit 461 then begins execution of the cached code for blocks 470 by performing a conventional call to it. Again, the code for performing blocks 470 must execute entirely within the cache 212 of the single designated processor K. This is not difficult to achieve, but it is a requirement. Also, in order to minimize stack references, routine 440 should not write to memory, call subroutines, should employ only local variables, and should declare as few variables as possible. Other systems may achieve the result of block 460 using other methods for executing code independently of the detaching memory.

Block 471 iterates through all source segments to be detached. If block 472 determines that the current segment is a kernel segment, block 473 copies its contents to its target module, as determined in block 443. Block 445 then replaces the contents of register 331 and register 332 in the target module with the values from the registers of the corresponding source segment. This effectively renames the segment, so that the same real addresses which had existed in the module 110 holding the source segment now physically reside in the target module, transparently to the remainder of the system. Block 475 resets the registers 330 of the module 110 which had held the source segment to values which will prevent that module from responding to the addresses in the range of the source segment. In system 100, for example, register settings of zero cause a module not to respond to any addresses at all. Also—or as an alternative—address router 130 or comparable means may contain conventional logic for disabling memory transfers to a particular system module 110.

For those source segments which block 442 identifies as non-kernel segments, control passes directly to reset block 475 from block 472. The time sequence of blocks 475 and 444 for detaching the non-kernel segments is not significant. They may be performed whenever convenient with respect to the remaining blocks of FIG. 4, and they might not require all the services of blocks 450 and 480. Reset block 475 need not execute if there is no need to disable the physical module from which a source segment came; for example, the relocation routine may load it with another segment.

Referring to the example memory map 120 of FIG. 1, the memory relocation moves kernel source segment 121-6 from system module 110-6 to module 110-7. The registers 331 and 332 of module 110-7 receive the starting address (hex '004 0000 0000') and the size (4 GB) of segment 121-6. The corresponding registers of module 110-6 are zeroed out or reset. In the case of a system module containing a non-kernel segment, the relocation task may move non-kernel segment 121-4 out of module 110-5 to disk, and reset the registers of the module whence it came. Segment 121-4 can, if necessary, be restored to system memory on another module (say 110-4) at any convenient time.

When block 471 determines that all source segments included in the remap routine have been processed, control passes to block 480. This block resumes the full operating system by substantially unwinding the steps of block 450.

Figure 6:
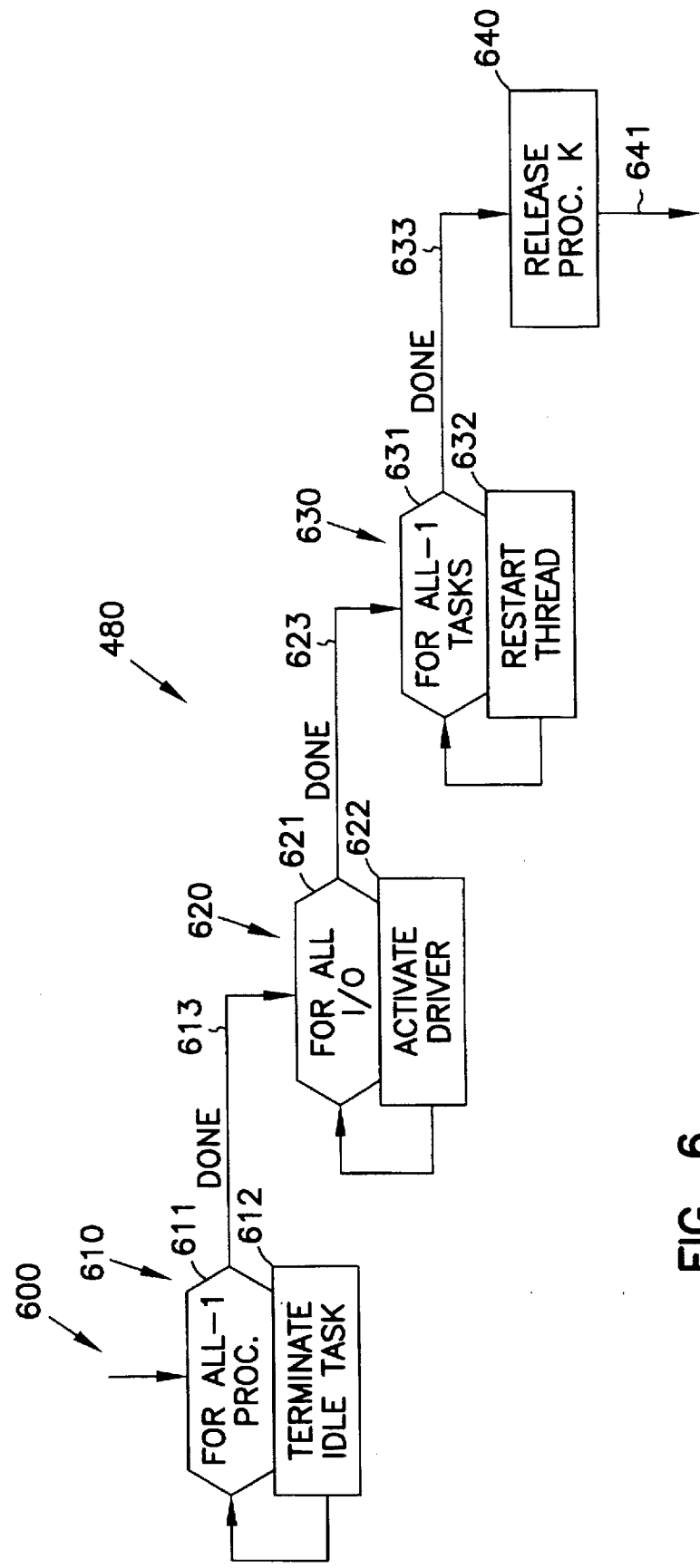
FIG. 6 details the resume-OS block of FIG. 4.

FIG. 6 details the steps 600 for resuming the operating system's normal mode. We prefer that the single processor K execute routine 600, although at least parts of it could run in other locations. Blocks 610 terminate the idling tasks initiated in blocks 550, FIG. 5. Block 611 iterates through processors 211, and block 612 terminates each loop initiated by block 552. When block 611 has stepped through every processor except for the one running routine 600 itself (I.e., processor K), exit 613 passes control to blocks 620. Block 621 retraces the step of block 541, reactivating each I/O driver in block 622. DONE exit 623 causes blocks 630 to resume the suspended program threads. Block 631 cycles through the wait list generated in blocks 530. Block 632 reactivates each suspended thread, allowing scheduler 420, FIG. 4, to assign it to one of the processors 211, FIG. 2. Finally, exit 633 leads to block 640, which unbinds routine 600 from processor K. Line 641 exits routine 600, so that control passes from block 480 to block 420 as shown by line 481 in FIG. 4. This concludes the relocation task, and resumes the execution of normal user and system tasks. Except for new steps 610 and 640, routine 600 is a part of the conventional checkpoint/resume feature of the Solaris operating-system product.

After the conclusion of the relocation routine described above, the operating system resumes normal processing of user and system tasks. The OS kernel executes user tasks and its own functions using the same real addresses as before, except that the system now automatically locates these addresses in system module 110-7, instead of finding them in module 110-6. That is, the relocation of the OS kernel is transparent to every function of the system, even though it employs supposedly fixed addresses within its address space. Detached system module 110-7 may now be removed from system 100, serviced in place, assigned to a different segment, used as-is but without its memory subsystem 230, or dealt with in any desired manner, without affecting the OS kernel. Moreover, the relocation task which physically relocates these addresses may itself refer to them even while they are being moved from one system module to another.

FIGS. 1–6 describe a presently preferred embodiment of the invention. Many variations within the spirit of the invention will occur to those skilled in the art. For example, the invention easily accommodates system architectures of the more usual kind, which implement processors and memory subsystems on separate boards or cards. A single relocation task may move multiple segments, and may move them to any desired combination of target locations. Segments may have differing sizes, and may be combined and split. The preceding description explicitly and implicitly suggests other particular modifications as well.

We claim:

1. A method for transparently relocating a source kernel segment of memory from a source memory location in a data-processing system to a target memory location within said system, so that after said relocating, the target location responds to the original real addresses of said source segment, and so that said system may continue to use the original contents of said source segment at all times during the execution of said method by said same system, said method comprising:

identifying said source segment by means of its real addresses;

determining a target location for receiving the contents of said source segment;

quiescing the operating system of said system;

loading a remap routine within said system in such a way that its execution is guaranteed not to refer to any memory located within said source segment;

executing said remap routine so as to copy the contents of said source segment from said source location to said target location;

renaming said target location so as to respond to said original real addresses;

inhibiting said source segment so as to not respond to said original real addresses;

resuming said operating system.

2. The method of claim 1, for additionally relocating at least one source segment which is not a kernel segment, comprising the further steps of:

identifying a certain segment as a non-kernel source segment;

flushing the contents of said non-kernel source segment to secondary storage.

3. The method of claim 1, wherein the step of quiescing said operating system is performed substantially entirely by a designated one of multiple processors for executing tasks concurrently within said data-processing system.

4. The method of claim 3, wherein the step of quiescing said operating system includes preventing certain of said processors from referencing memory in said source segment.

5. The method of claim 3, including suspending substantially all tasks executing in said multiple processors, except for said designated processor.

6. The method of claim 5, including dispatching an idle task to said multiple processors other than said designated processor, said idle task contain no external memory references.

7. The method of claim 5, wherein resuming said operating system includes restarting said substantially all tasks.

8. The method of claim 1, wherein said system includes multiple processors, the method including designating one of said processors in said system to execute said remap routine, and loading said remap routine entirely into a cache of said one processor.

9. The method of claim 8, wherein said remap routine contains no jumps longer than a line length of said cache.

10. The method of claim 1, wherein renaming said target location includes loading a register associated with said target location with a least one value specifying the real addresses of said source segment.

11. The method of claim 10, wherein said at least one value comprises a first value indicating one of said real addresses of said source segment, and a second value indicating a size of said source segment.

12. The method of claim 10, comprising the further step of resetting a register associated with said source location to a value different from any real address of said source segment.

13. A data-processing system, comprising:

a plurality of processors for executing multiple concurrent tasks;

a plurality of individual banks of memory, each having a range of real addresses;

a plurality of rewritable segment registers associated with respective ones of said memory banks, for holding segment data indicating the particular real addresses assigned to its memory bank;

control means for loading different values into said segment registers;

an operating system for controlling the execution of tasks in said processors, said operating system containing direct coded references to said real addresses in at least one segment of said memory;

segment-relocation means located entirely within said system and employing at least one of said same plurality of processors for transparently moving a source segment of a source one of said banks of memory to a target one of said banks entirely within said data-processing system, said relocation means quiescing said operating system before commencing said moving, so that after said moving the target bank responds to the original real addresses of said source segment, said relocation means employing the contents of said source segment for the entire period of time during which it moves said source segment to said target bank.

14. The system of claim 13, wherein said data-processing system comprises:

a plurality of system modules each capable of holding a subset of said processors and a subset of said memory banks;

an address router coupled to said system modules for carrying addresses among said modules, such that said memory banks in all said modules have a single address space;

a data router coupled to said system modules for carrying data among said modules in response to addresses specified by said address router.

15. The system of claim 14, wherein said segment registers reside on said system modules and are coupled to said address router and to said data router for loading segment data into said registers.

16. The system of claim 13, wherein said segment registers respond to unique respective addresses for rewriting said segment data thereinto.

17. The system of claim 16, wherein said memory banks reside in a first address space, and wherein said segment registers in a second address space separate from said first address space.

18. The system of claim 16, wherein said segment data comprises a segment base address and a segment size.

19. The system of claim 13, wherein each of said processors includes a cache for holding data and instructions for said each processor.

20. The system of claim 19, wherein said relocation means includes a remap portion operating exclusively from the cache belonging to a designated one of said processors.

* * * * *

UNITED STATES PATENT AND TRADEMARK OFFICE
CERTIFICATE OF CORRECTION

PATENT NO. : 5,765,198
DATED : June 9, 1998
INVENTOR(S) : Andrew Jackson McCrocklin et al It is certified that error appears in the above-identified patent and that said Letters Patent is hereby corrected as shown below:

At Col. 2, line 48, please delete "," after "during".

At Col. 3, line 52, please delete "'07FF" and add --'07F--.

At Col. 4, line 14, please add a --.-- after "module".

At Col. 11, line 34, please delete "change" and insert --changing--.

At Col. 11, line 47, please delete "a" and add --at--.

At Col. 12, line 35, please delete "ail" and add --all--.

At Col. 12, line 49, please delete "registers in" and insert --registers reside in--.

Signed and Sealed this

Fifteenth Day of May, 2001

Attest:

NICHOLAS P. GODICI

Attesting Officer

Acting Director of the United States Patent and Trademark Office